United States Patent [19]
Yanagida

[11] Patent Number: 5,376,234
[45] Date of Patent: Dec. 27, 1994

[54] DRY ETCHING METHOD

[75] Inventor: Toshiharu Yanagida, Kanagawa, Japan

[73] Assignee: Sony Corporation, Tokyo, Japan

[21] Appl. No.: 78,928

[22] Filed: Jun. 21, 1993

[30] Foreign Application Priority Data

Jun. 29, 1992 [JP] Japan .................................. 4-170980

[51] Int. Cl.$^5$ ............................................. H01L 21/00
[52] U.S. Cl. ..................................... 156/662; 156/643;
156/646; 156/653; 437/228
[58] Field of Search ............... 156/643, 646, 652, 653,
156/664, 662; 437/228

[56] References Cited
FOREIGN PATENT DOCUMENTS 3-276626 12/1991 Japan .
4-084427  3/1992 Japan .
4-170026  6/1992 Japan .
4-258117  9/1992 Japan .

Primary Examiner—R. Bruce Breneman
Assistant Examiner—George Goudreau
Attorney, Agent, or Firm—Hill, Steadman & Simpson

[57] ABSTRACT

A dry etching method wherein one compound selected from mercaptan, thioether and disulfide each having a fluorocarbon side chain is used as a main component of an etching gas. These compounds may form $CF_x^+$ and S on dissociation due to electric discharges, and contribute to high-rate etching and surface protection of a wafer. If a halogen compound such as CO, $SOF_2$ or NOF is added to the etching gas, a high-rate etching reaction due to extraction of O atoms from $SiO_2$ and structural reinforcement of carbonaceous polymer become possible. Also, $S_2F_2$ may be added for reinforcing deposition of S. These effects lead to a reduction of the deposit amount of polymer necessary for highly selective processing, and contribute greatly to low pollution in a process.

12 Claims, 1 Drawing Sheet

DRY ETCHING METHOD

BACKGROUND OF THE INVENTION

(1) Field of the Invention

The present invention relates to a dry etching method applied in the manufacturing field of semiconductor devices, and particularly to a dry etching method for etching a silicon compound layer whereby high selectivity, high etchrate, low damage and low pollution can be achieved in processing a minute contact hole.

(2) Description of the Related Art

As large-scale integration and high performance of semiconductor devices as seen in recent VLSI have proceeded, higher processing precision is required for dry etching of a silicon compound layer represented by silicon oxide ($SiO_2$).

First, the enlargement of the area of the device chip due to large-scale integration has increased the size of the wafer. Uniform processing within the wafer surface due to high minuteness of the pattern to be formed is required. Also, multiple-kind small-quantity production as represented by ASIC is required. On the basis of these backgrounds, the main stream of dry etching has been shifting from the traditional batch processing toward the single wafer processing. In this case, for maintaining productivity equal to that achieved in the past, the etchrate per wafer must be improved significantly.

In addition, with a shallow junction of an impurity diffused region for attaining high etchrate and minuteness of the device, and thin material layers of various types, an etching technique whereby higher selectivity to the underlying layer and lower damage than in the past is required. For instance, an $SiO_2$ interlayer insulation film is etched with a silicon substrate or a polysilicon layer as an underlying layer, when a contact is to be formed in an impurity diffused region formed within a semiconductor substrate or in source-drain regions of a PMOS transistor employed as a resistive load element of SRAM.

Etching of an $SiO_2$ based material layer has been carried out conventionally in a mode of increased ionicity for cutting a rigid Si—O bond. Typical etching gases are $CHF_3$, $CF_4$ and the like, and incident ion energy of $CF_x^+$ released therefrom is used. However, for carrying out high-rate etching, it is necessary to increase the incident ion energy, and the etching reaction becomes close to a physical sputtering reaction. Therefore, high etchrate and selectivity have always been incompatible with each other.

Conventionally, $H_2$ or a depositional hydrocarbonaceous gas is added to the etching gas, so as to increase an apparent ratio of the number of carbon atoms to the number of fluorine atoms or C/F ratio. Thus, deposition of carbonaceous polymer generated competitively with the etching reaction is accelerated, thereby achieving high selectivity.

Instead of these conventional etching gases, the present applicant previously proposed a dry etching method for etching a silicon compound layer using a saturated or unsaturated high-order chain fluorocarbonaceous gas having two or more carbons, in the Japanese Patent KOKAI Publication Serial No. 3-276626. The proposed dry etching method is aimed at attaining high etchrate by using a fluorocarbonaceous gas such as $C_2F_6$, $C_3F_8$, $C_4F_{10}$, $C_4F_8$ and the like, thus efficiently forming a large quantity of $CF_x^+$ from one molecule. However, the single use of the high-order chain fluorocarbonaceous gas increases the amount of formed F*, and the selection ratios to the resist and to the underlying layer cannot be set sufficiently large. For instance, in case of etching an $SiO_2$ layer on a silicon substrate using $C_3F_8$ as an etching gas, though high etchrate is achieved, problems remain such as low selectivity to the resist of about 1.3, shortage of etching durability and generation of dimensional losses due to retreat of the pattern edge. Since selectivity to silicon is about 4.2, a problem remains also in overetching durability.

Thus, in order to solve these problems, two-stage etching is carried out in the above-mentioned prior art, wherein etching with a single use of a high-order chain fluorocarbonaceous gas is suspended shortly before exposure of the underlying layer, and wherein, in etching a remaining portion of a silicon compound layer, a hydrocarbonaceous gas such as ethylene ($C_2H_4$) is added to the compound so as to accelerate deposition of carbonaceous polymer. The object of this technique is to supply C atoms in the etching reaction system and to increase the apparent C/F ratio by consuming excessive F* with H* formed in a plasma for forming HF.

However, under the status quo wherein design rules of the semiconductor device is highly minute, dimensional losses from the etching mask is hardly allowable. Even though two-stage etching as mentioned above is carried out, it is necessary to further improve selectivity in the etching of the first stage. Also, as further minuteness proceeds, effects of particle pollution due to carbonaceous polymer may become serious. Therefore, it is preferable to minimize the amount of a depositional gas such as a hydrocarbonaceous gas in the etching of the second stage.

In view of the above-mentioned status of the art, the present inventor proposed a technique wherein a silicon compound layer is etched, with the temperature of a substrate to be etched being controlled to not higher than 50° C., using a chain unsaturated fluorocarbon compound having at least one unsaturated bond within a molecule, in the specification of the Japanese Patent Application No. 2-295225. The chain unsaturated fluorocarbon compound is, for example, octafluorobutene ($C_4F_8$), hexafluoropropene ($C_3F_6$) and the like. Theoretically, since these gases form two or more $CF_x^+$ from one molecule on dissociation due to electric discharges, high-rate etching of $SiO_2$ becomes possible. Also, with the unsaturated bond within the molecule, highly active radicals tend to be generated by dissociation, and polymerization of carbonaceous polymer can be accelerated. Furthermore, since the temperature of the substrate to be etched is controlled to not higher than 50° C., the deposition of the carbonaceous polymer can be accelerated.

With this technique, selectivity to the resist and to the silicon underlying layer was improved significantly without using the depositional gas, and the particle pollution was reduced.

Further, the present inventor previously proposed a technique wherein an etching gas containing a saturated or unsaturated fluorocarbon compound having a cyclic portion at least in part of a molecule structure is used, in the specification of the Japanese Patent Application No. 3-40966. The cyclic fluorocarbon compound has at least three carbons, and has a higher C/F ratio than a chain fluorocarbon compound with the same number of carbons. Therefore, high-rate etching due to a large quantity of $CF_x^+$ and highly selective etching due to efficient formation of polymer become possible.

In this manner, the above-mentioned chain unsaturated fluorocarbon compound or the cyclic fluorocarbon compound rendered it possible to carry out highly selective etching of a silicon compound layer using an etching gas of single composition.

However, in order to provide a process which can be adapted to production of a future ULSI device, it is necessary to further improve selectivity to the resist for the following reason. That is, in such a large-scale integration device, long-time overetching is indispensable due to an increase of surface steps of the silicon compound layer to be etched. At this time, dimensional losses are generated unless the resist is prevented from retreating.

As another problem, it is necessary to further reduce the particle pollution. The technique using the chain unsaturated fluorocarbon compound, the cyclic fluorocarbon compound and the like has no difference from the conventional technique in that the mechanism for securing selective ratios is attained by deposition of carbonaceous polymer proceeding competitively with the etching reaction. Therefore, if the number of wafer processings is increased, carbonaceous polymer is stored in the etching chamber, thereby deteriorating the particle level. Accordingly, under the status quo wherein the particle pollution is reduced, there is only limited improvements such as a reduction in the frequency of maintenance for cleaning the etching chamber.

OBJECT OF THE INVENTION

Thus, it is an object of the present invention to provide a dry etching method for etching a silicon compound layer whereby it is possible to attain higher selectivity and lower pollution than in the past and to exhibit high etchrate and low damage.

SUMMARY OF THE INVENTION

According to the present invention, there is provided a dry etching method for etching a silicon compound layer, comprising using an etching gas containing at least one compound selected from the group consisting of mercaptan having a fluorocarbon side chain, thioether having a fluorocarbon side chain and disulfide having a fluorocarbon side chain.

According to the present invention, there is also provided a dry etching method wherein the etching gas contains at least one compound selected from the group consisting of: carbon monoxide; a halogen compound having in a molecule a halogen atom and at least one functional group selected from carbonyl; thionyl, sulfuryl, nitryl and nitrosyl; and carbonyl sulfide.

According to the present invention, there is further provided a dry etching method wherein the etching gas contains at least one sulfur fluoride selected from the group consisting of $S_2F_2$, $SF_2$, $SF_4$ and $S_2F_{10}$, and wherein etching is carried out while supplying depositable S to an etching reaction system.

The fluorocarbon side chain is expressed by a general formula $-C_xF_y$. However, x and y are natural numbers, satisfying conditions of $y \leq 2x+1$. That is, the carbon skeleton structure thereof may be one of low order or high order, straight chain or branching, chain or cyclic, and saturated or unsaturated. For instance, in case of $y=2x+1$, the fluorocarbon side chain corresponds to straight-chain or branching parfluoroalkyl. In case of $y<2x+1$, chain unsaturation is structurally possible, and particularly in case of $x \geq 3$, cyclic saturation and cyclic unsaturation become possible.

An upper limit of the number of carbons x is not set, and may be suitably selected within a range in which carbon in a gasified state can be easily introduced into the etching reaction system, and in which a ratio of the number of C atoms to the number of S atoms (C/S ratio) or a ratio of the number of C atoms to the number of O atoms (C/O ratio) is not excessively large. The above-mentioned fact is, as later described, important for full realization of an intention of the present invention that excessive deposition of carbonaceous polymer is prevented by combustion due to O* and partial substitution of S for the deposits.

Among the halogen compounds, those having one carbonyl in a molecule are $COF_2$ (carbonyl fluoride), $COCl_2$ (carbonyl chloride or phosgene), $COBr_2$ (carbonyl bromide; liquid), $COClF$ (carbonyl chloride fluoride), $COBrF$ (carbonyl bromide fluoride), $COIF$ (carbonyl iodide fluoride; liquid) and the like. Those having two carbonyls in a molecule are $C_2F_2O_2$ (oxalyl fluoride; liquid), $C_2Cl_2O_2$ (oxalyl chloride; liquid), $C_2Br_2O_2$ (oxalyl bromide; liquid) and the like.

Halogen compounds having thionyl in a molecule are $SOF_2$ (thionyl fluoride), $SOF_4$ (thionyl tetrafluoride), $SOCl_2$ (thionyl chloride; liquid), $SOBr_2$ (thionyl bromide) $SOClBr$ (thionyl chloride bromide; liquid) and the like.

Halogen compounds having sulfuryl in a molecule are $SO_2F_2$ (sulfuryl fluoride), $SO_2Cl_2$ (sulfuryl chloride; liquid), $SO_2ClF$ (sulfuryl chloride fluoride), $SO_2BrF$ (sulfuryl bromide fluoride; liquid ) and the like.

Halogen compounds having nitrosyl in a molecule are $NOF$ (nitrosyl fluoride), $NOCl$ (nitrosyl chloride), $NOCl_2$ (nitrosyl dichloride), $NOCl_3$ (nitrosyl trichloride), $NOBr$ (nitrosyl bromide; liquid) and the like.

Further, halogen compounds having nitryl in a molecule are $NO_2F$ (nitryl fluoride), $NO_2Cl$ (nitryl chloride), $NO_2Br$ (nitryl bromide) and the like.

The compounds denoted by "liquid" are liquid substances at the normal temperature. These compounds may be gasified by bubbling due to an inactive gas such as He, and then be introduced into the etching chamber. The compounds without denotation of "liquid" are all gaseous.

The present inventor considered that surface protection effects can be improved while attaining low pollution, not by simply depending on carbonaceous polymer for surface protection, but by substituting a part thereof for other substances unlikely to be sources of pollution. Thus, the present inventor has noted sulfur (S). Since S is a sublimating substance, it can be easily deposited on the surface of a wafer if the wafer is cooled to not higher than the normal temperature. At this time, on a material layer releasing O atoms by sputtering such as an $SiO_2$ material layer, S is removed in the form of $SO_x$ without being deposited, and contributes to sidewall protection, surface protection of an exposed silicon based underlying layer and surface protection of the resist mask. In addition, in removing the resist mask by $O_2$ plasma ashing after etching, S can be simultaneously removed by combustion, Also, S can be removed by sublimation only if the wafer is heated to about 90° C. or higher. In any case, S does not become a source of particle pollution.

In the present invention, the compounds used as a main components of the etching gas, that is mercaptan, thioether and disulfide each having a fluorocarbon side chain, are selected for the purpose of supplying both the S atom and $CF_x^+$ which is a conventional etchant for the silicon based compound layer from a single compound, The S atom is formed by dissociating one of —S— bond (mercapto group), —S— bond (sulfide bond) and —S—S— bond (disulfide) by electric discharges, The deposit amount of carbonaceous polymer necessary for highly selective processing is relatively reduced by the deposition of S.

On the other hand $CF_x^+$ is formed on dissociation of the fluorocarbon side chain due to electric discharges. If the number of carbons x of the fluorocarbon side chain is 2 or larger, high-rate etching becomes possible as in the case of using the high-order fluorocarbon compound previously proposed by the present inventor. Further, if the fluorocarbon side chain has an unsaturated bond or a cyclic structure, efficient polymerization of carbonaceous polymer proceeds.

The present invention is based on the foregoing ideas. In addition, a method for attaining objects such as high etchrate, high selectivity, low damage and low pollution through extraction of O atoms from an $SiO_2$ material layer due to reducing action, reinforcement of film quality of carbonaceous polymer and reinforcement of deposition of sulfur is proposed.

One of the methods for realizing these objects is to add to the etching gas, carbon monoxide (CO), or a halogen compound containing in a molecule a halogen atom and at least one functional group selected from carbonyl (>C=O), thionyl (>S=O), sulfuryl (>SO_2), nitrosyl (—N=O) and nitryl (—NO_2), or carbonyl sulfide (COS; molecule structure S=C=O).

With the above-mentioned compounds, electric dipoles exist in the C—O bond, S—O bond and N—O bond, Respectively, and high polymerization accelerating activity is exhibited. Accordingly, since such functional groups or atomic groups derived therefrom are present in a plasma, polymerization degree of carbonaceous polymer rises, thereby increasing durability to ion incidence and radical attacks. It has been made clear by studies in recent years that if the functional groups are introduced into carbonaceous polymer, higher chemical and physical stability than in the conventional carbonaceous polymer constituted by a simple repetitive structure of —$CX_2$— can be attained. It is understood that the introduction of the functional groups increases polarity of carbonaceous polymer, so as to increase electrostatic adsorption force to the wafer negatively electrified during etching, thereby attaining the above-mentioned chemical and physical stability. Accordingly, only a small deposit amount of carbonaceous polymer necessary for attaining high selectivity to the resist material and the Si based material is sufficient, and thoroughly low pollution compared with the conventional technique can be achieved, In addition, the functional groups contribute to high etchrate Radicals such as CO*, SO*, $SO_2$*, NO* and the like, which can be formed from the functional groups, have strong reducing action, and can extract O atoms in $SiO_2$, This can be understood from the fact that interatomic bond energy calculated from heat of generation of a two-atom molecule is 257 kcal/mol in the C—O bond, 125 kcal/tool in the S—O bond, 151 kcal/tool in the N—O bond, and 111 kcal/mol in the Si—O bond in a crystal. The Si atom after extraction of O atom is combined with halogen radicals dissociated from the halogen compound and thereby is quickly removed in the form of halide. In short, with the present invention, the Si—O bond may be cut not only by conventional physical sputtering action due to $CF_x^+$ ions but also by chemical action. Moreover, CO, halogen compounds, or COS used in the present invention exercises no action on the resist material or the underlying Si based material, thereby maintaining low etchrate for etching these materials.

Particularly in case of using. COS, S can be deposited.

Further, when it is preferable to reinforce the deposition of S, at least one sulfur fluoride selected from $S_2F_2$, $SF_2$, $SF_4$, $S_2F_{10}$ is added to the etching gas.

Sulfur fluoride used here is a compound previously proposed by the present applicant for etching an $SiO_2$ based material layer in the Japanese Patent KOKAI Publication Serial No. 4-84427. The main etchant formed from sulfur fluoride is $SF_x^+$ and F*. The abovementioned sulfur fluoride has a larger S/F ratio (ratio of the number of S atoms to the number of F atoms in one molecule) than $SF_6$ conventionally adapted to practical use as an etching gas, and therefore can release free S into a plasma on dissociation due to electric discharges.

If the sulfur fluoride is used together with a halogen compound having nitrosyl or nitryl, a released S atom reacts with an N atom released from the halogen compound, so as to form a sulfur nitride based compound consisting mainly of polythiazyl $(SN)_x$, thereby making it possible to exhibit stronger sidewall protection effects and protection effects for the Si underlying layer than S. Moreover, in removing the resist mask by conventional $O_2$ plasma ashing after etching, the sulfur nitride based compound can be simultaneously removed by combustion. Otherwise, the sulfur nitride based compound can be sublimated or decomposed only heating the wafer to approximately 130° C. or higher. In any case, the sulfur nitride based compound, as in the case of S, is unlikely to become a source of particle pollution.

BRIEF DESCRIPTION OF THE DRAWINGS

FIG. 1a shows a state in which a resist mask is formed on an $SiO_2$ interlayer insulation film. FIG. 1b shows a state in which a contact hole is formed.

EMBODIMENTS

Example 1

In the present example wherein the present invention was applied to contact hole processing, an $SiO_2$ interlayer insulation film was etched using $C_2F_6S_2$ [bis (trifluoromethyl) disulfide; $F_3C$—S—S—$CF_3$]. The process is explained with reference to FIGS. 1a and 1b.

Figure 1:
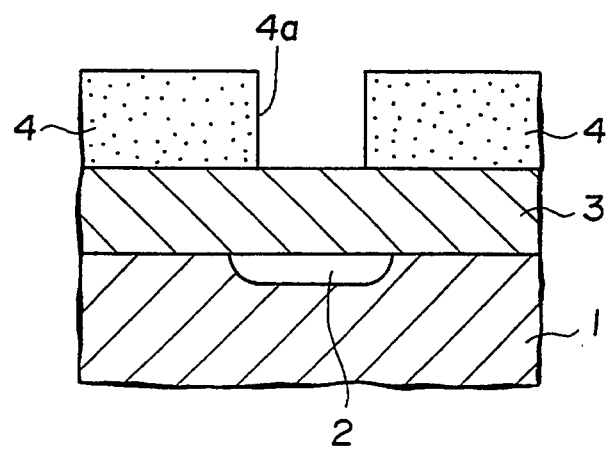
FIGS. 1a and 1b are schematic cross-sectional views showing an example of processes in which the present invention is applied to contact hole processing, in order of the processes.
Figure 1:
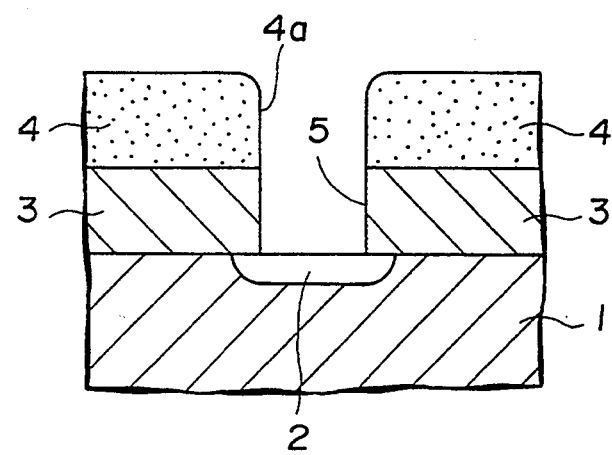

A wafer used as a sample in the present example is constituted by forming an $SiO_2$ interlayer insulation film 3 onto a single crystal Si substrate 1 on which an impurity diffused region 2 as underlying metallization is formed in advance, and forming thereon a resist mask 4 patterned in a predetermined shape, as shown in FIG. 1a. The resist mask 4 has an aperture 4a formed, the aperture having a diameter of about 35 μm.

The wafer was set on a wafer setting electrode of a magnetron reactive ion etching or RIE device. The wafer setting electrode has a cooling pipe therein. By supplying a coolant to the cooling pipe from a cooling facility such as a chiller connected outside of the device, so as to circulate the coolant, thereby controlling the temperature of the wafer during etching to not higher than room temperature. The $SiO_2$ interlayer insulation film 3 was etched, for example, under the following conditions:

$C_2F_6S_2$ flow rate 50 SCCM
gas pressure 2.0 Pa
RF power density 2.0 W/cm² (13.56 MHz)
magnetic field strength $1.50 \times 10^{-2}$ T (=150 G)
wafer temperature −30° C. (with an ethanol based coolant)

In this etching process, high-rate etching with an etchrate of about 850 nm/min. due to $CF_x^+$ and $F^*$ dissociated from $C_2F_6S_2$, proceeded, and a contact hole 5 having an anisotropic shape was formed, as shown in FIG. 1b.

At this time, active fragments to be materials of carbonaceous polymer and S were released from $C_2F_6S_2$. On an exposed surface of the $SiO_2$ interlayer insulation film 3, the active fragments and S were combusted by the action of O atoms sputtered out therefrom, and therefore were not deposited. The active fragments and S were deposited on the resist mask 4 and an exposed surface of the single crystal Si substrate 1, thereby exhibiting surface protection effects. Under the above-mentioned conditions, since the wafer was cooled, the etchrate for etching the resist material and the single crystal Si, which would be otherwise etched in a radical mode, was lowered. For these reasons, in the present example, a high resist selection ratio of about 6 and a high Si selection ratio of about 25 were achieved. Even after overetching, no retreat of the resist mask 4 and no destruction of a shallow junction were observed.

Also, the carbonaceous polymer and S were deposited on sidewall surfaces of the pattern where vertical ion incidence rarely occurs, thereby forming sidewall protection films, not shown. The anisotropic shape of the contact hole 5 was achieved by contribution of the sidewall protection films.

Meanwhile, in the process of the present example, since the deposition of S can be expected, the deposit amount of carbonaceous polymer necessary for highly selective, anisotropic processing can be reduced. Therefore, the particle level was improved significantly compared with the conventional process. Accordingly, the frequency of maintenance such as cleaning of an etching chamber was reduced, and productivity was improved.

Example 2

In the present example, the same contact hole processing was carried out, using a $C_2F_6S_2/CO$ mixed gas.

A wafer as shown in FIG. 1a was set on a magnet ton RIE device, and an $SiO_2$ interlayer insulation film 3 was etched, for example, under the following conditions:

$C_2F_6S_2$ flow rate 35 SCCM
CO flow rate 15 SCCM
gas pressure 2.0 Pa
RF power density 1.5 W/cm² (13.56 MHz)
magnetic field strength $1.50 \times 10^{-2}$ T (=150 G)
wafer temperature 0° C. (with an ethanol based coolant)

In this etching process, extraction reaction of O atoms from the $SiO_2$ interlayer insulation film 3 due to $CO^*$ chemically assisted physical etching reaction due to $CF_x^+$ in proceeding. Accordingly, despite the lower ion incidence energy than in example 1, highly anisotropic etching was carried out. In addition, selection ratios to a resist mask 4 and to a single crystal Si substrate 1 were improved by the lower energy, thereby making it possible to set the wafer temperature closer to a room temperature range than in example 1.

Example 3

In the present example, the same contact hole processing was carried out, using a $C_2F_6S_2/COF_2$ mixed gas.

A wafer as shown in FIG. 1a was set on a magnetron RIE device, and an $SiO_2$ interlayer insulation film 3 was etched, for example, under the following conditions:

$C_2F_6S_2$ flow rate 35 SCCM
$COF_2$ flow rate 15 SCCM
gas pressure 2.0 Pa
RF power density 1.5 W/cm² (13.56 MHz)
magnetic field strength $1.50 \times 10^{-2}$ T (=150 G)
wafer temperature 0° C. (with an ethanol based coolant)

In this etching process, film quality of carbonaceous polymer was reinforced by introducing a part of dissociation products of $COF_2$ due to electric discharges, in the form of carbonyl or C—O bonds, into carbonaceous polymer, thereby exhibiting high durability to the sputtering reaction of incident ions, despite a small amount of deposits. Also, an extraction reaction of O atoms due to $CO^*$ dissociated from $COF_2$ accelerated etching of $SiO_2$ by $CF_x^+$. As a result, despite the lower energy of incident ions and higher wafer temperature than in example 1, high-rate, highly selective etching was carried out. Further, since the deposit amount of carbonaceous polymer was reduced, particle pollution was inhibited significantly.

Example 4

In the present example, the same contact hole processing was carried out, using a $C_2F_6S_2/SOF_2$ mixed gas.

A wafer as shown in FIG. 1a was set on a magnetron RIE device, and an $SiO_2$ interlayer insulation film was etched, for example, under the following conditions:

$C_2F_6S_2$ flow rate 35 SCCM
$SOF_2$ flow rate 15 SCCM
gas pressure 2.0 Pa
RF power density 1.4 W/cm² (13.56 MHz)
magnetic field strength $1.50 \times 10^{-2}$ T (=150 G)
wafer temperature 0° C. (with an ethanol based coolant)

In this etching process, film quality of carbonaceous polymer was reinforced by introducing a part of dissociation products of $SOF_2$ due to electric discharges, in the form of carbonyl or S—O bonds, into carbonaceous polymer, thereby exhibiting high durability to the sputtering reaction of incident ions, despite a small amount of deposits. Also, an extraction reaction of O atoms due to $SO^*$ dissociated from $SOF_2$ accelerated etching of $SiO_2$ by $CF_x^+$. As a result despite the lower energy of incident ions and higher wafer temperature than in example 1, high-rate, highly selective etching was carried out. Further, since the deposit amount of carbonaceous polymer was reduced, particle pollution was inhibited significantly.

Example 5

In the present example, the same contact hole processing was carried out, using a $C_2F_6S_2/COS$ mixed gas.

A wafer as shown in FIG. 1a was set on a magnet ton RIE device, and an SiO$_2$ interlayer insulation film 3 was etched, for example, under the following conditions:

C$_2$F$_6$S$_2$ flow rate 35 SCCM
COF flow rate 20 SCCM
gas pressure 2.0 Pa
RF power density 1.2 W/cm$^2$ (13.56 MHz)
magnetic field strength $1.50 \times 10^{-2}$ T (=150 G)
wafer temperature 0° C. (with an ethanol based coolant)

In this etching process, effects such as contribution of S dissociated from COS to surface protection of the wafer, as well as an extraction reaction of O atoms due to CO* and reinforcement of film quality of carbonaceous polymer due to introduction of carbonyl and C—O bonds, were obtained. Therefore, the energy of incident ions was further reduced. Also, since contribution of carbonaceous polymer in surface protection of the wafer was relatively lowered, lower pollution was achieved.

Example 6

In the present example, the same contact hole processing was carried out, using a C$_2$F$_6$S$_2$/S$_2$F$_2$ mixed gas.

A wafer as shown in FIG. 1a was set on a magnetron RIE device, and an SiO$_2$ interlayer insulation film was etched, for example, under the following conditions:

C$_2$F$_6$S$_2$ flow rate 30 SCCM
S$_2$F$_2$ flow rate 20 SCCM
gas pressure 2.0 Pa
RF power density 1.2 W/cm$^2$ (13.56 MHz)
magnetic field strength $1.50 \times 10^{-2}$ T (=150 G)
wafer temperature 10° C. (cooling by water)

Advantages in this etching process is that SF$_x^+$ formed from S$_2$F$_2$ was used as an etchant, and that S which was also efficiently formed from S$_2$F$_2$ was deposited on the wafer, so as to be utilized for surface protection. In short, in addition to effects of carbonaceous polymer and S formed from C$_2$F$_6$S$_2$, S was also supplied from S$_2$F$_2$, thereby reinforcing surface protection effects. Therefore, despite the higher wafer temperature than in example 5, highly selective, anisotropic etching was carried out.

Meanwhile, S deposited on the wafer was sublimated or combusted together with carbonaceous polymer when a resist mask 4 was removed by conventional O$_2$ plasma ashing and the like after etching. Thus, no particle pollution was left on the wafer.

Example 7

In the present example, the same contact hole processing was carried out, using a C$_2$F$_6$S$_2$/S$_2$F$_2$/NOF mixed gas.

A wafer as shown in FIG. 1a was set on a magnetron RIE device, and an SiO$_2$ interlayer insulation film 3 was etched, for example, under the following conditions:

C$_2$F$_6$S$_2$ flow rate 30 SCCM
S$_2$F$_2$ flow rate 10 SCCM
NOF flow rate 10 SCCM
gas pressure 2.0 Pa
RF power density 1.2 W/cm$^2$ (13.56 MHz)
magnetic field strength $1.50 \times 10^{-2}$ T (=150 G)
wafer temperature 20° C. (cooling by water)

Advantages in this process are extraction of O atoms due to NO* and reinforcement of carbonaceous polymer due to introduction of nitrosyl and N—O bonds. In addition, S atoms formed from S$_2$F$_2$ and N atoms formed from NOF were combined, so as to form various sulfur nitride based compounds consisting mainly of polythiazyl (SN)$_x$ in a polymerized state, thereby contributing to surface protection of the wafer. Therefore, despite that etching was carried out with the higher wafer temperature than in example 6, which is in the room temperature range, high selectivity and anisotropy were achieved.

Meanwhile, the sulfur nitride based compounds deposited on the wafer were sublimated or combusted together with carbonaceous polymer when a resist mask 4 was removed in a process of conventional O$_2$ plasma ashing after the etching. Thus, no particle pollution was left on the wafer.

The present invention has been described on the basis of the above seven examples. However, the present invention is not limited to these examples.

For instance, compounds limited by the present invention other than those used in the above examples may have basically the same effects. In such a case, mercaptan, thioether and disulfide which constitute main components of an etching gas, and various kinds of halogen compounds and/or various kinds of sulfur fluoride can be arbitrarily combined.

The silicon compound layer may be comprised of a silicon based material such as PSG, BSG, BPSG, AsSG, AsPSG and AsBSG, or SiN$_x$, other than the above-mentioned SiO$_2$ interlayer insulation film.

The constitution of the wafer used as an etching sample is not limited to the above-mentioned constitution. For example, the underlying layer of the SiO$_2$ interlayer insulation film may be of a polysilicon layer, a polycide layer, or a metallic material layer such as an Al-1% Si layer and a refractory metal layer, other than the single crystal Si substrate.

A rare gas such as AF may be suitably added to the etching gas for the purpose of obtaining the sputtering effect, dilution effect and cooling effect.

It is a matter of course that the etching device to be used and the etching conditions can be suitably changed.

As is clear from the above description, with the present invention, a compound having in a molecule an S atom and a fluorocarbon side chain is used as a main component of the etching gas, thereby making it possible to deposit S along with carbonaceous polymer. Therefore, the silicon compound layer can be etched with high-rate, high selectivity, low pollution and low damage, using basically an etching gas of single composition. Further, by using an additional gas, it becomes possible to attain a higher etchrate, lower pollution and lower damage through reinforcement of carbonaceous polymer, an extraction reaction of O atoms and reinforcement of S deposition, Particularly, through full achievement of low pollution, yield and reliability of the semiconductor device are improved, and the time for maintenance is reduced, thereby making improvements in productivity and economy.

The present invention is extremely useful for producing semiconductor devices which are designed on the basis of minute design rules, and require large-scale integration, high performance and high reliability.

What is claimed is:

1. A plasma etching method for etching a silicon compound layer, comprising the steps of:
   providing a patterned masking material over the silicon compound layer to expose the areas of the silicon compound layer to be etched; and etching the exposed silicon compound layer using an etching gas comprising at least one sulfur-containing compound selected from the group consisting of mercaptan having a fluorocarbon side chain, thioether having a fluorocarbon side chain, and disulfide having fluorocarbon side chain.

2. The plasma etching method as claimed in claim 1, wherein said silicon compound layer is selected from the group consisting of a silicon oxide based material layer and a silicon nitride based material layer.

3. The plasma etching method as claimed in claim 1, wherein said silicon compound layer is formed on a base layer which is selected from the group consisting of an impurity diffused region in a single crystal Si substrate, a polysilicon layer, a polycide film, an Al based material layer, and a refractory metal layer.

4. The plasma etching method as claimed in claim 1, wherein said etching gas comprises at least one kind of sulfur fluoride selected from the group consisting of $S_2F_2$, $SF_2$, $SF_4$ and $S_2F_{10}$, for supplying depositable S during the etching step.

5. The plasma etching method as claimed in claim 1, wherein said disulfide is bis (trifluoromethyl) disulfide.

6. The plasma etching method as claimed in claim 1, wherein said etching gas comprises at least one compound selected from a second group consisting of carbon monoxide and carbonyl sulfide.

7. The dry etching method as claimed in claim 6, wherein said silicon compound layer is selected from the group consisting of a silicon oxide based material layer and a silicon nitride based material layer.

8. The plasma etching method as claimed in claim 6, wherein said silicon compound layer is formed on a base layer which is selected from the group consisting of an impurity diffused region in a single crystal Si substrate, a polysilicon layer, a polycide film, an Al based material layer, and a refractory metal layer.

9. The plasma etching method as claimed in claim 6, wherein said halogen compound is selected from the group consisting of carbonyl fluoride, thionyl fluoride and nitrosyl fluoride.

10. The plasma etching method as claimed in claim 6, wherein said etching gas comprises at least one kind of sulfur fluoride selected from the group consisting of $S_2F_2$, $SF_2$, $SF_4$ and $S_2F_{10}$, for supplying depositable S during the etching step.

11. The dry etching method as claimed in claim 6, wherein said disulfide is bis (trifluoromethyl) disulfide, 12. A plasma etching method as claimed in claim 1, wherein said etching gas comprises a halogen compound having in a molecule a halogen atom and at least one functional group selected from the group consisting of carbonyl, thionyl, sulfuryl, nitryl and nitrosyl functional groups.

* * * * *